United States Patent
Choi

(10) Patent No.: US 11,776,630 B2
(45) Date of Patent: Oct. 3, 2023

(54) MEMORY DEVICE PERFORMING INCREMENTAL STEP PULSE PROGRAM OPERATION AND OPERATING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 145 days.

(21) Appl. No.: 17/531,542

(22) Filed: Nov. 19, 2021

(65) Prior Publication Data

US 2022/0392539 A1 Dec. 8, 2022

(30) Foreign Application Priority Data

Jun. 7, 2021 (KR) .......................... 10-2021-0073681

(51) Int. Cl.
| | |
|---|---|
| *G11C 16/26* | (2006.01) |
| *G11C 16/10* | (2006.01) |
| *G11C 16/08* | (2006.01) |
| *G11C 7/10* | (2006.01) |
| *G11C 7/12* | (2006.01) |
| *G11C 16/30* | (2006.01) |

(52) U.S. Cl.
CPC ............ *G11C 16/102* (2013.01); *G11C 7/106* (2013.01); *G11C 7/1087* (2013.01); *G11C 7/12* (2013.01); *G11C 16/08* (2013.01); *G11C 16/26* (2013.01); *G11C 16/30* (2013.01)

(58) Field of Classification Search
CPC ..... G11C 16/102; G11C 7/106; G11C 7/1087; G11C 7/12; G11C 16/08; G11C 16/26; G11C 16/30; G11C 16/32; G11C 11/5642; G11C 2211/5642; G11C 16/0483; G11C 16/10; G11C 16/24; G11C 16/3459; G11C 11/5628; G11C 8/08; G11C 8/10

See application file for complete search history.

(56) References Cited

U.S. PATENT DOCUMENTS

2016/0027513 A1* 1/2016 Lee ..................... G11C 11/5621
365/185.02

FOREIGN PATENT DOCUMENTS

KR 10-1039884 B1 6/2011

* cited by examiner

*Primary Examiner* — Xiaochun L Chen
(74) *Attorney, Agent, or Firm* — IP & T GROUP LLP

(57) ABSTRACT

A memory device comprises a memory cell array and a control circuit. The control circuit applies a pass voltage to each of a selected and unselected word line from a first to second time point whenever a program loop is performed once. Then, the control circuit applies a program voltage to the selected word line and the pass voltage to the unselected word line from the second to third time point, performs a bit line precharge operation from a fourth time point ahead of the first time point to the second time point when a first program loop is performed, and performs the bit line precharge operation from the fourth time point to a fifth time point, which is the same as or ahead of the first time point, when the other program loops are performed.

13 Claims, 9 Drawing Sheets

MEMORY DEVICE PERFORMING INCREMENTAL STEP PULSE PROGRAM OPERATION AND OPERATING METHOD THEREOF

CROSS-REFERENCE TO RELATED APPLICATION(S)

The present application claims priority under 35 U.S.C. § 119(a) to Korean Patent Application No. 10-2021-0073681, filed on Jun. 7, 2021, the disclosure of which is incorporated herein by reference in its entirety.

BACKGROUND

1. Field

Various embodiments of the present disclosure generally relate to an electronic device, and more particularly, to a memory device performing a program operation according to an incremental step pulse program (ISPP) scheme, and an operating method of the memory device.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when the power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when the power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

Various embodiments of the present disclosure are directed to a memory device capable of preventing a decrease in program efficiency due to channel boosting during a program operation according to an incremental step pulse program (ISPP) scheme, and an operating method of the memory device.

In accordance with an embodiment of the present invention, a memory device may include: a memory cell array including a plurality of memory cells coupled between a plurality of word lines and a plurality of bit lines; and a control circuit suitable for performing a program operation of repeatedly performing a program loop until programming is completed according to an incremental step pulse program (ISPP) scheme, the program loop including: applying a pass voltage to each of a first word line selected as a program target and a second word line unselected among the plurality of word lines from a first time point to a second time point, and applying a program voltage to the first word line and the pass voltage to the second word line from the second time point to a third time point. The control circuit may perform the program operation by: performing a bit line precharge operation of precharging each of the plurality of bit lines to a predetermined potential level from a fourth time point ahead of the first time point to the second time point during a first program loop, and performing the bit line precharge operation from the fourth time point to a fifth time point, which is the same as or ahead of the first time point, during each of remaining program loops except for the first program loop.

The control circuit may include: an address decoder suitable for applying the pass voltage or the program voltage to the plurality of word lines; and a plurality of page buffers connected to the plurality of memory cells through the plurality of bit lines, respectively. Each of the plurality of page buffers may include: a latch suitable for latching a logic level determined according to whether programming is allowed for a corresponding bit line; and a bit line controller suitable for electrically connecting the bit lines to a power supply voltage terminal or a ground voltage terminal based on the logic level latched by the latch, during the bit line precharge operation.

The latch may latch a first logic level when the programming is allowed for the corresponding bit line.

The latch may latch a second logic level when the programming is inhibited for the corresponding bit line.

The bit line controller may electrically connect the bit line to the ground voltage terminal when the latch latches the first logic level during the bit line precharge operation.

The bit line controller may electrically connect the bit line to the power supply voltage terminal when the latch latches the second logic level during the bit line precharge operation.

The bit line controller may include: a first connection control component suitable for electrically connecting the corresponding bit line to a sensing node in response to a first control signal; a second connection control component suitable for electrically connecting the sensing node to the power supply voltage terminal in response to a second control signal and the logic level of the latch; and a third connection control component suitable for electrically connecting the sensing node to the ground voltage terminal in response to a third control signal and the logic level of the latch.

The control circuit may further include a control logic suitable for: activating the first to third control signals from the fourth time point to the second time point during the first program loop, and activating the first to third control signals from the fourth time point to the fifth time point during each of the remaining program loops.

In accordance with an embodiment of the present invention, an operating method of a memory device including a plurality of memory cells coupled between a plurality of word lines and a plurality of bit lines, may include: a program loop operation of applying a pass voltage to each of a first word line selected as a program target and a second word line unselected among the plurality of word lines from a first time point to a second time point after a starting time point, and applying a program voltage to the first word line and the pass voltage to the second word line from the second time point to a third time point; and a repetition operation of repeatedly performing the program loop operation according to an incremental step pulse program (ISPP) scheme until programming is completed. The repetition operation may include: a first precharge operation of performing a bit line precharge operation of precharging each of the plurality of bit lines to a predetermined potential level from a fourth time point ahead of the first time point to the second time point during a first program loop operation first repeated in the repetition operation; and a second precharge operation of performing the bit line precharge operation from the fourth time point to a fifth time point, which is the same as or ahead of the first time point, during a subsequent program loop operation repeated after the first program loop operation in the repetition operation.

Each of the first and second precharge operations may include: a latching operation of determining and latching a logic level corresponding to each of the plurality of bit lines, according to whether the programming is allowed for each of the plurality of bit lines during the program loop operation; and a connection operation of electrically connecting each of the plurality of bit lines to a power supply voltage terminal or a ground voltage terminal based on the latched logic level during the bit line precharge operation.

The latching operation may include: latching a first logic level corresponding to a first bit line for which the programming is allowed among the plurality of bit lines; and latching a second logic level corresponding to a second bit line for which the programming is inhibited among the plurality of bit lines.

The connection operation may include: electrically connecting the first bit line to the ground voltage terminal during the bit line precharge operation; and electrically connecting the second bit line to the power supply voltage terminal during the bit line precharge operation.

In accordance with an embodiment of the present invention, a method for operating a memory device, may include: performing, on a memory cell array, a program operation including initial and subsequent program loops according to an incremental step pulse program (ISPP) scheme. The initial program loop may include precharging a bit line coupled to the array before and while applying a pass voltage to all word lines coupled to the array. The subsequent program loop may include precharging the bit line before the applying. The precharging in the initial program loop may take a greater time amount than the precharging in the subsequent program loop.

Technical problems to be solved by the present disclosure are not limited to the technical problems described above, and other technical problems not described herein will be apparently understood by those skilled in the art, to which the present disclosure pertains, from the following description.

DETAILED DESCRIPTION

Figure 1:
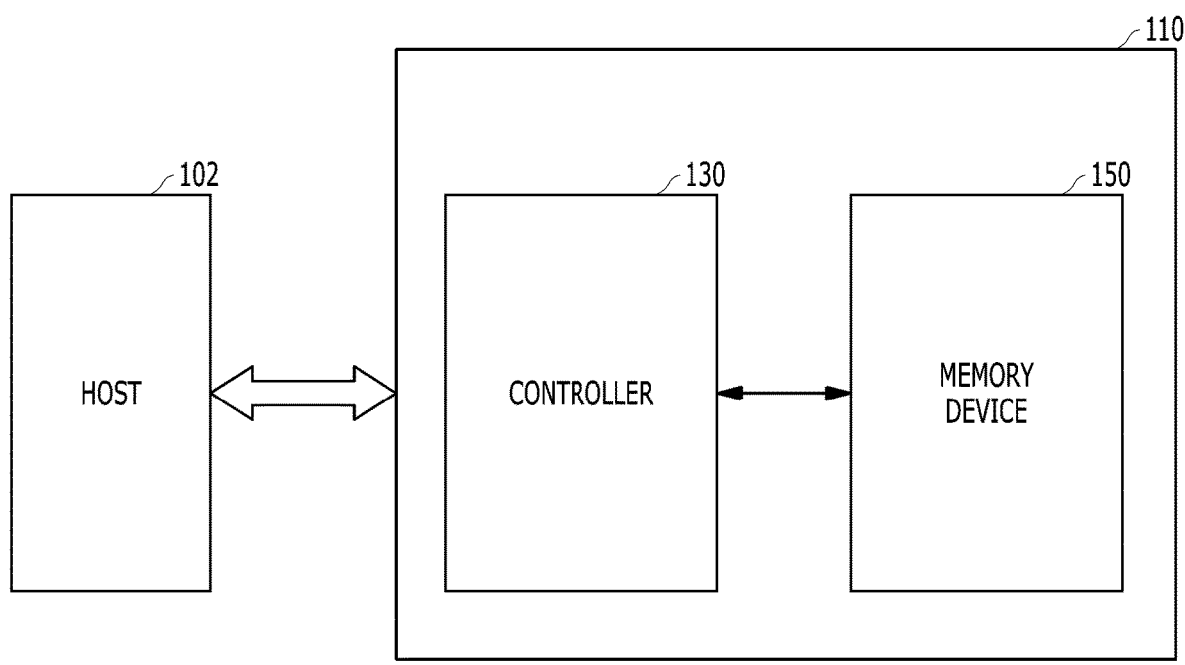
FIG. 1 is a diagram illustrating a memory system in accordance with an embodiment of the present disclosure.

Various embodiments of the present disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the present disclosure are described in detail below with reference to the accompanying drawings, wherein like numbers reference like elements.

FIG. 1 is a diagram illustrating a memory system in accordance with an embodiment of the present disclosure.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

The memory device 150 may include a memory cell array (not illustrated) including a plurality of memory cells that store data.

The memory cell array may include a plurality of memory blocks. Each of the memory blocks may include the plurality of memory cells. One memory block may include a plurality of pages. According to an embodiment, each of the pages may be a unit for storing data in the memory device 150 or reading data stored in the memory device 150. Each of the memory blocks may be a unit for erasing data.

According to an embodiment, the memory device 150 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM) or a spin transfer torque random access memory (SU-RAM). In the present embodiment, for convenience in description, the memory device 150 is the NAND flash memory.

The memory device 150 may be configured to receive a command and an address from the controller 130 and access a region selected by an address in the memory cell array. The memory device 150 may perform an operation, corresponding to a command, on the region selected by the address. For example, the memory device 150 may perform a write operation, i.e., a program operation, a read operation and an erase operation. During the program operation, the memory device 150 may program data in the region selected by the address. During the read operation, the memory device 150 may read data from the region selected by the address. During the erase operation, the memory device 150 may erase data stored in the region selected by the address.

The controller 130 may control overall operations of the memory system 110.

When power is applied to the memory system 110, the controller 130 may execute firmware (FW). When the memory device 150 is a flash memory device, the firmware (FW) may include a host interface layer (HIL) that controls communication with the host 102, and the controller 130 may include a flash translation layer (FTL) that controls communication between the host 102 and the memory device 150 and a flash interface layer (FIL) that controls communication with the memory device 150.

According to an embodiment, the controller 130 may receive data and a logical block address (LBA) from the host 102, and convert the logical block address into a physical block address (PBA) indicating an address of a memory cell in which data included in the memory device 150 is to be stored. In the present embodiment, the "logical block address" and a "logical address" may have the same meaning. In the present embodiment, the "physical block address" and a "physical address" may have the same meaning.

The controller 130 may control the memory device 150 to perform the program, read or erase operation according to a request of the host 102. During the program operation, the controller 130 may provide the memory device 150 with a write command, a physical block address and data. During the read operation, the controller 130 may provide the memory device 150 with a read command and a physical block address. During the erase operation, the controller 130 may provide the memory device 150 with an erase command and a physical block address.

According to an embodiment, the controller 130 may generate a command, an address and data by itself regardless of a request of the host 102, and transmit the generated command, address and data to the memory device 150. For example, the controller 130 may provide the memory device 150 with a command, an address and data for performing the read and program operations accompanied by wear leveling, read reclaim and garbage collection operations.

According to an embodiment, the controller 130 may control two or more memory devices 150. In this case, the controller 130 may control the memory devices 150 in an interleaving method to improve operational performance thereof. The interleaving method may be a method of controlling operations of two or more memory devices 150 to overlap each other.

The host 102 may communicate with the memory system 110 through at least one of various communication standards or interfaces, such as universal serial bus (USB), serial advanced technology attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multi-media card (MMC), embedded MMC (eMMC), dual in-line memory module (DIMM), registered DIMM (RDIMM) and load reduced DIMM (LRDIMM).

Figure 2:
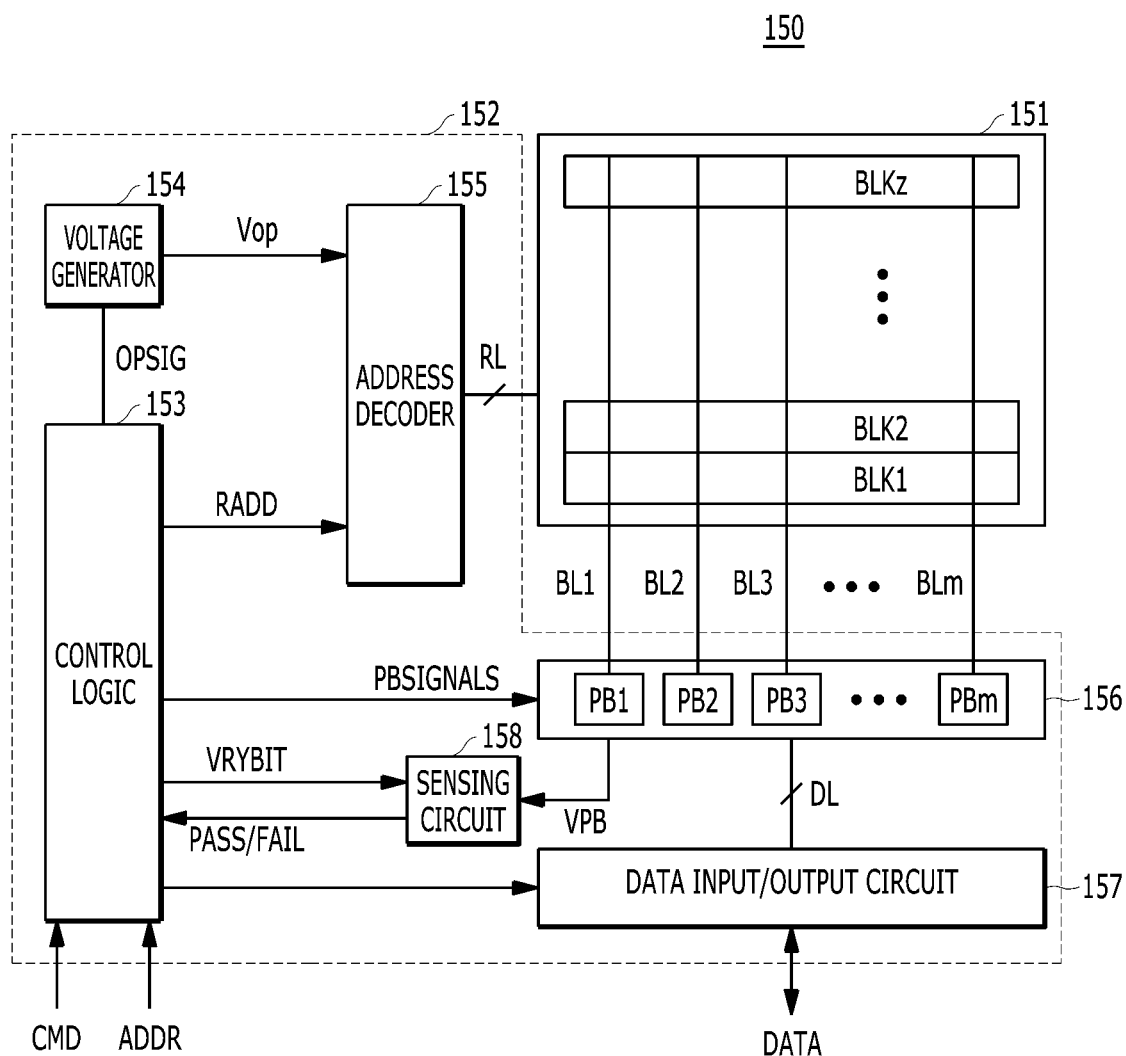
FIG. 2 is a detailed diagram illustrating a memory device illustrated in FIG. 1 in accordance with an embodiment of the present disclosure.

FIG. 2 is a detailed diagram illustrating the memory device 150 illustrated in FIG. 1 in accordance with an embodiment of the present disclosure.

Referring to FIG. 2, the memory device 150 may include a memory cell array 151 and a control circuit 152.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The memory cells included in the memory cell array 151 may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The control circuit 152 may be configured to perform a program, read or erase operation on a selected region of the memory cell array 151. The control circuit 152 may drive the memory cell array 151. For example, the control circuit 152 may apply various operating voltages to the row line RL and the bit lines BL1 to BLm, or discharge the applied voltages.

The control circuit 152 may include the address decoder 155, a voltage generator 154, the page buffer group 156, a data input/output circuit 157, a sensing circuit 158 and a control logic 153.

The control circuit 152 may drive the memory cell array 151. For example, the control circuit 152 may drive the memory cell array 151 to perform the program, read and erase operations.

The address decoder 155 may be connected to the memory cell array 151 through the row line RL. The row line RL may include the drain selection line, the word lines, the source selection line and a common source line. According to an embodiment, the word lines may include a normal word line and a dummy word line. According to an embodiment, the row line RL may further include a pipe selection line.

The address decoder 155 may be configured to operate in response to the control of the control logic 153. The address decoder 155 may receive an address RADD from the control logic 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltages Vop, which are supplied from the voltage generator 154, to the selected word line.

During the program operation, the address decoder 155 may apply a program voltage to the selected word line, and apply a pass voltage having a lower level than the program voltage to an unselected word line. During a program verification operation, the address decoder 155 may apply a verification voltage to the selected word line, and apply a verification pass voltage having a higher level than the verification voltage to the unselected word line.

During the read operation, the address decoder 155 may apply a read voltage to the selected word line, and apply a read pass voltage having a higher level than the read voltage to the unselected word line.

According to an embodiment, the erase operation of the memory device 150 may be performed in units of memory blocks. An address ADDR inputted to the memory device 150 during the erase operation may include a block address. The address decoder 155 may decode the block address, and select at least one memory block according to the decoded block address. During the erase operation, the address decoder 155 may apply a ground voltage to a word line of the selected memory block.

The voltage generator 154 may be configured to generate a plurality of operating voltages Vop by using an external power supply voltage supplied to the memory device 150. The voltage generator 154 may operate in response to the control of the control logic 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic 153.

The data input/output circuit 157 may include a plurality of input/output buffers (not illustrated) that receive the data DATA inputted thereto. During the program operation, the data input/output circuit 157 may receive the data DATA to be stored from the controller 130 (refer to FIG. 1). The data input/output circuit 157 may output the data DATA, which is transmitted from the plurality of page buffers PB1 to PBm included in the page buffer group 156, to the controller 130 (refer to FIG. 1) during the read operation.

During the read operation or the verification operation, the sensing circuit 158 may generate a reference current in response to an allowable bit VRYBIT generated by the control logic 153, and output a pass signal PASS or a fail signal FAIL to the control logic 153 by comparing a sensing voltage VPB received from the page buffer group 156 with a reference voltage attributable to the reference current.

The control logic 153 may be connected to the address decoder 155, the voltage generator 154, the page buffer group 156, the data input/output circuit 157 and the sensing circuit 158. The control logic 153 may be configured to control overall operations of the memory device 150. The control logic 153 may operate in response to a command CMD transmitted from an external device.

The control logic 153 may generate various signals in response to the command CMD and the address ADDR, and control the other components 154 to 158 included in the control circuit 152. For example, the control logic 153 may generate an operation signal OPSIG, the address RADD, read and write circuit control signals PBSIGNALS and the allowable bit VRYBIT in response to the command CMD and the address ADDR. The control logic 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic 153 may determine whether the verification operation has passed or failed, in response to the pass or fail signal PASS or FAIL outputted by the sensing circuit 158.

Figure 3:
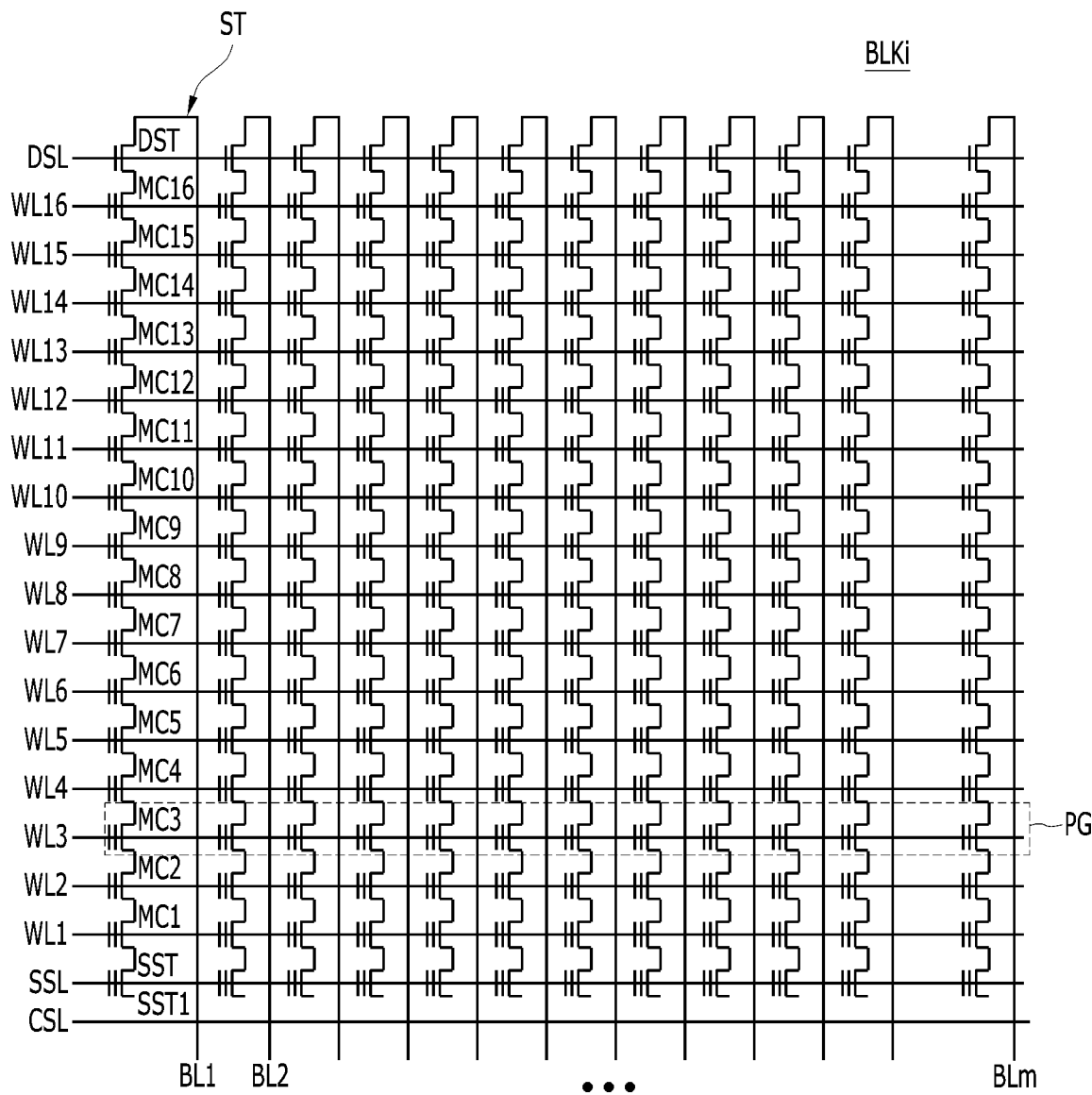
FIG. 3 is a detailed diagram illustrating a memory block illustrated in FIG. 2 in accordance with an embodiment of the present disclosure.

FIG. 3 is a detailed diagram illustrating a memory block illustrated in FIG. 2 in accordance with an embodiment of the present disclosure.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells MC1 to MC16 may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the number of word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the number of cells included in one physical page PG.

One memory cell may store two or more bits of data. In this case, one physical page PG may store two or more logical page (LPG) data.

Figure 4:
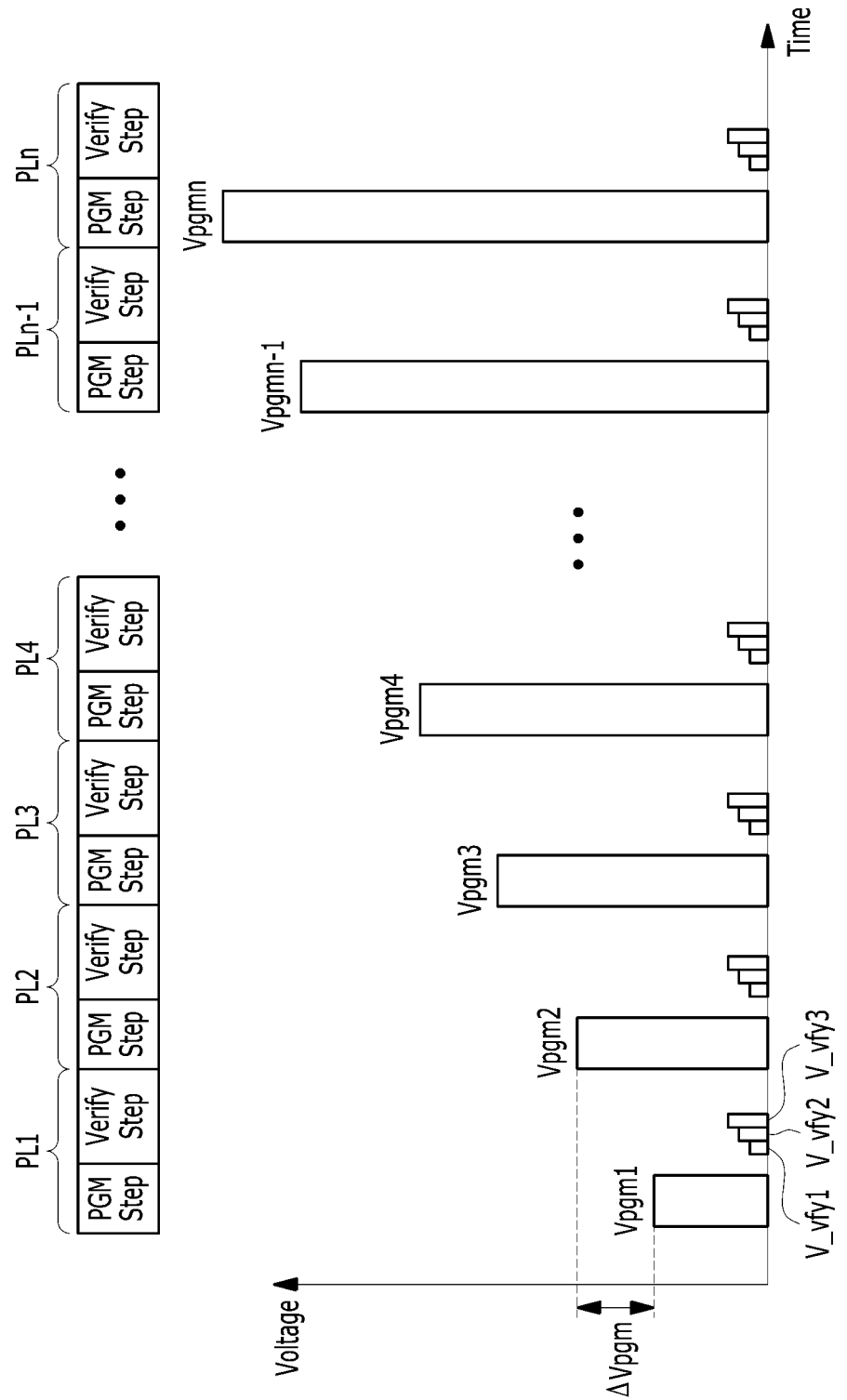
FIG. 4 is a diagram illustrating an incremental step pulse program (ISPP) scheme in accordance with an embodiment of the present disclosure.

FIG. 4 is a diagram illustrating an incremental step pulse program (ISPP) scheme in accordance with an embodiment of the present disclosure.

Referring to FIG. 4, a program operation according to the ISPP scheme may include a plurality of program loops PL1 to PLn. That is, the memory device 150 performing the program operation may repeatedly perform the plurality of program loops PL1 to PLn one by one in a predetermined order until the program operation is completely performed, so that a selected memory cell may have one of a plurality of program states.

Each of the program loops PL1 to PLn may include a program voltage applying step ("PGM Step") for applying a program voltage and a verification step ("Verify Step") for applying a verification voltage and determining whether a memory cell is programmed.

In the program voltage applying step, a program voltage applying operation of applying the program voltage to a selected word line connected to a memory cell selected as a program target may be performed. The memory cell selected through the program voltage applying operation may be programmed into one of the plurality of program states.

According to an embodiment, whenever each of the program loops PL1 to PLn is performed in the program operation, a potential level of the program voltage may increase. That is, as each of the program loops PL1 to PLn is repeatedly performed, the level of the program voltage may increase or decrease in a stepwise manner by a predetermined increment in voltage. The number of times for application of the program voltage used in each of the program loops PL1 to PLn, the voltage level and the voltage applying time may be determined in various forms under the control of the control logic 153.

A program voltage may be applied to a word line selected as a program target. A pass voltage may be applied to the other unselected word lines except for the word line selected as the program target. The memory device 150 may include a plurality of memory blocks, and each of the plurality of memory blocks may include a plurality of word lines. Accordingly, among the plurality of word lines included in one memory block selected as the program target, the program voltage may be applied to the selected word line, and the pass voltage may be applied to the other unselected word lines.

According to an embodiment, the pass voltage may be applied to all the word lines included in the memory block selected as the program target from a first time point to a second time point after a start time point in each of the program loops PL1 to PLn. Subsequently, in the memory block selected from the second time point to a third time point, the program voltage may be applied to the word line selected as the program target, and the pass voltage may be continuously applied to the unselected word lines. According to an embodiment, the pass voltage may always have a predetermined level. According to an embodiment, the pass voltage may have different levels depending on physical locations of the word line.

A program allowable voltage may be applied to a selected bit line connected to the memory cell selected as the program target. A program inhibited voltage may be applied to unselected bit lines connected to memory cells other than the memory cell selected as the program target. According to an embodiment, the program allowable voltage may be a ground voltage VSS, and the program inhibited voltage may be a power supply voltage VCORE.

Whenever each of the program loops PL1 to PLn is performed, a bit line precharge operation may be performed to precharge each of the plurality of bit lines BL1 to BLm connected to the plurality of memory cells to a predetermined potential level, for example, a program allowable potential level or a program inhibited potential level.

According to an embodiment, the bit line precharge operation of precharging each of the plurality of bit lines BL1 to BLm connected to the plurality of memory cells to the predetermined potential level when the first program loop PL1 among the plurality of program loops PL1 to PLn is performed may be controlled to have a longer time than the bit line precharge operation of precharging each of the plurality of bit lines BL1 to BLm connected to the plurality of memory cells to the predetermined potential level when each of the remaining program loops PL2 to PLn except for the first program loop PL1 is performed.

For example, when the first program loop PL1 is performed, the bit line precharge operation of precharging each of the plurality of bit lines BL1 to BLm connected to the plurality of memory cells to the predetermined potential level may be performed from a fourth time point ahead of the first time point to the second time point.

When each of the remaining program loops PL2 to PLn except for the first program loop PL1 is performed, the bit line precharge operation of precharging each of the plurality of bit lines BL1 to BLm connected to the plurality of memory cells to the predetermined potential level may be performed from the fourth time point to a fifth time point which is the same as or ahead of the first time point.

Herein, the fourth time point may be a time point ahead of the first time point at which the pass voltage starts to be applied to a plurality of word lines included in the memory block selected as the program target. The second time point, which is later than the first time point, may be a time point at which the program voltage starts to be applied to a word line selected as the program target among the plurality of word lines included in the memory block selected as the program target. The fifth time point may be a time point the same as or ahead of the first time point at which the pass voltage starts to be applied to all of the word lines of the selected memory block.

Accordingly, it may be seen that among the plurality of program loops PL1 to PLn, the bit line precharge operation performed in the first program loop PL1 and the bit line precharge operation performed in each of the remaining program loops PL2 to PLn except for the first program loop PL1 start at the same time point, i.e., the fourth time point, but terminate at different time points, i.e., the second time point and the fifth time point. At this time, since the second time point is later than the fifth time point, it may be seen that the bit line precharge operation performed in the first program loop PL1 among the plurality of program loops PL1 to PLn takes a longer time than the bit line precharge operation performed in each of the remaining program loops PL2 to PLn except for the first program loop PL1.

In the program verification operation, the memory device 150 may apply a verification voltage to the word line selected as the program target, and apply a verification pass voltage to the unselected word lines. The memory device 150 may sense a voltage or a current outputted through a bit line to which each memory cell connected to the word line selected as the program target is connected, and determine whether the verification step is a pass or failure based on the sensed result.

In the program verification operation, the program verification operation for at least one program state among a plurality of program states may be performed. For example, when a memory cell to be programmed into a $k^{th}$ (where "k" is a natural number equal to or greater than 1) program state is read as an off cell by the verification voltage corresponding to the $k^{th}$ program state, the program verification operation for the $k^{th}$ program state may be passed.

In FIG. 4, when the memory cell selected as the program target is a multi-level cell (MLC) storing two-bit data, the selected memory cell may be programmed into an erase state and one of first to third program states. The number of data bits stored in the memory cell is not limited to the present embodiment.

In this case, when the first program loop PL1 is performed, a first program voltage Vpgm1 may be applied, and then first to third verification voltages V_vfy1 to V_vfy3 may be sequentially applied in order to verify the program states of the plurality of memory cells. In this case, a memory cell whose target state is a first program state may be verified by the first verification voltage V_vfy1, a memory cell whose target state is a second program state may be verified by the second verification voltage V_vfy2, and a memory cell whose target state is a third program state may be verified by the third verification voltage V_vfy3. The number of verification voltages is not limited to the present embodiment.

The memory cells that have been verified as "pass" by the verification voltages V_vfy1 to V_vfy3 may be determined to have target states, and then be converted to program inhibited states in the second program loop PL2. A program inhibited voltage may be applied to bit lines connected to the program inhibited memory cells. A second program voltage Vpgm2 that is higher than the first program voltage Vpgm1 by a unit voltage ΔVpgm2 may be applied to a selected word line in the second program loop PL2.

The verification operation for the second program loop PL2 may be the same as the verification operation for the first program loop PL1. A verification pass indicates that a memory cell is read as an off-cell by a corresponding verification voltage.

According to an embodiment, when the programming is not completed within a predetermined number of program loops, the program operation may be determined to be a failure. When the programming is completed within the predetermined number of program loops, the program operation may be determined to be a pass. Whether or not the programming is completed may be determined by whether the program verification operations for memory cells having a predetermined ratio or higher among the memory cells selected as the program targets have been passed.

According to an embodiment, at least one program loop may be performed during the program operation. Progress of the program loops may indicate how many program loops among the plurality of program loops PL1 to PLn are completely performed during the program operation.

Figure 5:
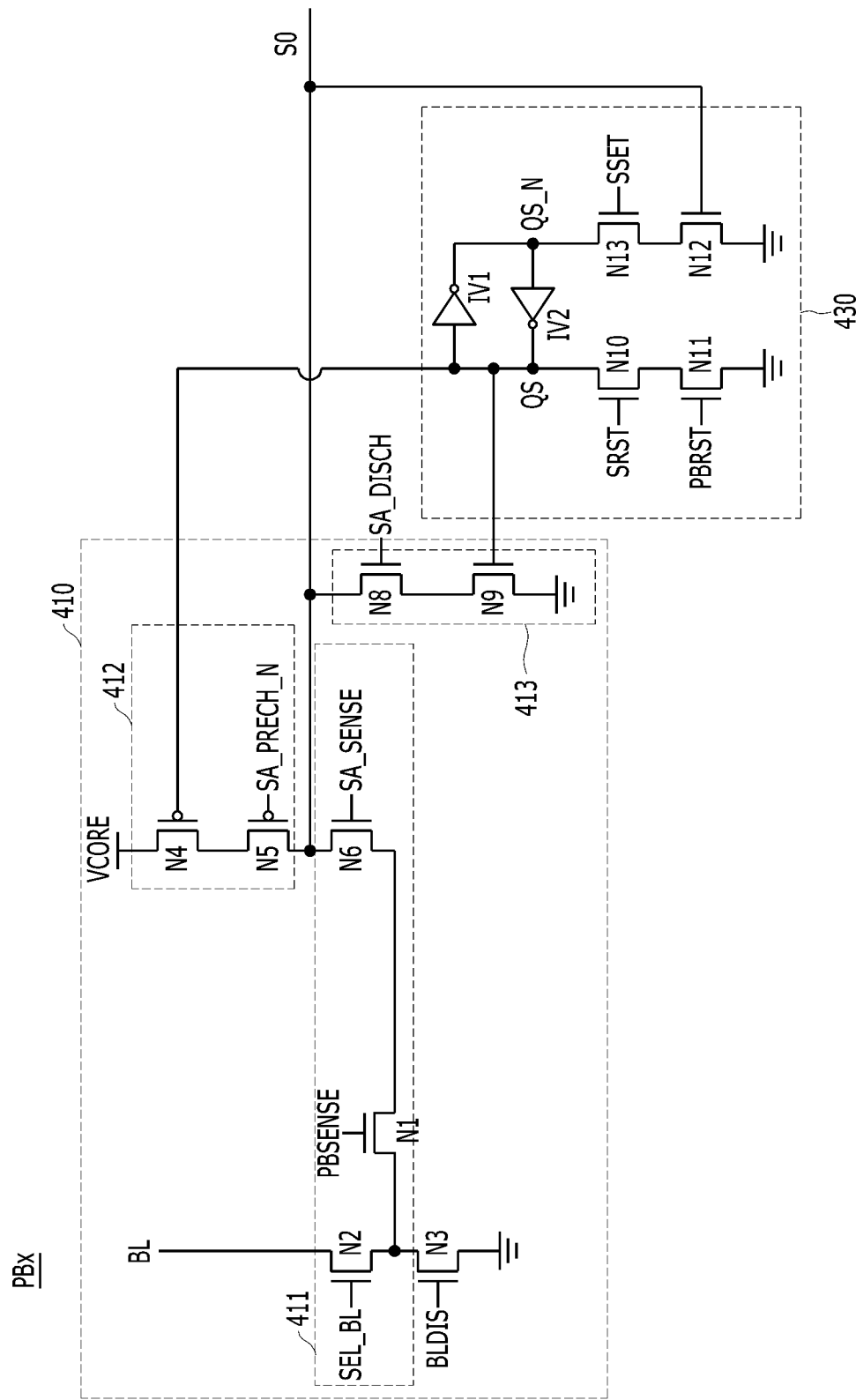
FIG. 5 is a detailed diagram illustrating a page buffer illustrated in FIG. 2 in accordance with an embodiment of the present disclosure.

FIG. 5 is a detailed diagram illustrating a page buffer illustrated in FIG. 2 in accordance with an embodiment of the present disclosure.

Referring to FIGS. 1 to 5, the memory device 150 may include the memory cell array 151 and the control circuit 152. The memory cell array 151 may include the plurality of memory cells connected between the plurality of word lines and the plurality of bit lines BL1 to BLm. In addition, the plurality of memory cells may be connected to the plurality of page buffers PB1 to PBm, included in the page buffer group 156 included in the control circuit 152, through the plurality of bit lines BL1 to BLm.

The plurality of page buffers PB1 to PBm may transmit and store data DATA, which is received from an external device through the data input/output circuit 157, into the plurality of memory cells through the bit lines BL1 to BLm under the control of the control logic 153. In addition, the plurality of page buffers PB1 to PBm may sense the data DATA stored in the plurality of memory cells under the control of the control logic 153, transmit the sensed data DATA to the data input/output circuit 157 through the bit lines BL1 to BLm, and output the transmitted data DATA to an external device through the data input/output circuit 157.

The operation of transmitting and storing the data DATA received from the external device into the plurality of memory cells through the bit lines BL1 to BLm by the plurality of page buffers PB1 to PBm may be an operation in which each of the plurality of memory cells included in the memory cell array 151 is programmed to have one of the plurality of program states according to values of the data DATA transmitted from the external device.

Specifically, each PBx of the plurality of page buffers PB1 to PBm according to an embodiment may be connected between any BL of the plurality of bit lines BL1 to BLm and a sensing node SO. In addition, each PBx of the plurality of page buffers PB1 to PBm may include a bit line controller 410 and a latch 430.

A logic level to be stored in the latch 430 included in each of the plurality of page buffers PB1 to PBm may be determined according to whether programming is allowed for each of the plurality of bit lines BL1 to BLm.

In addition, the bit line controller 410 included in each of the plurality of page buffers PB1 to PBm may electrically connect each of the plurality of bit lines BL1 to BLm to a power supply voltage VCORE terminal or a ground voltage VSS terminal based on the logic level to be stored in the latch 430 during a period in which the bit line precharge operation is performed.

The bit line precharge operation may refer to an operation of precharging each of the bit lines BL1 to BLm connected to the plurality of memory cells to a predetermined potential level, for example, a program allowable potential level or a program inhibited potential level whenever the plurality of program loops PL1 to PLn are performed one by one according to the ISPP scheme as described above with reference to FIG. 4. According to an embodiment, the program allowable voltage may be a ground voltage VSS, and the program inhibited voltage may be a power supply voltage VCORE.

More specifically, the control circuit 152 may control operations of the plurality of page buffers PB1 to PBm so that a first logic level is stored in the latch 430 corresponding to a first bit line for which the programming is allowed among the plurality of bit lines BL1 to BLm.

In addition, the control circuit 152 may control operations of the plurality of page buffers PB1 to PBm so that a second logic level is stored in the latch 430 corresponding to a second bit line for which the programming is inhibited among the plurality of bit lines BL1 to BLm.

For reference, the first and second logic levels may refer to logic levels opposite to each other. For example, when the first logic level is a logic "high" level corresponding to the power supply voltage VCORE, the second logic level may be a logic "low" level corresponding to the ground voltage VSS.

In addition, the bit line controller 410 included in each of the plurality of page buffers PB1 to PBm may electrically connect the bit line BL to the ground voltage VSS terminal when the first logic level is stored in the latch 430 during a period in which the bit line precharge operation is performed.

In addition, the bit line controller 410 included in each of the plurality of page buffers PB1 to PBm may electrically connect the bit line BL to the power supply voltage VSS terminal when the second logic level is stored in the latch 430 during a period in which the bit line precharge operation is performed.

More specifically, the bit line controller 410 included in each of the plurality of page buffers PB1 to PBm may include a first connection control component 411, a second connection control component 412 and a third connection control component 413.

The first connection control component 411 may electrically connect the bit line BL to the sensing node SO in response to first control signals SEL_BL, PBSENSE and SA_SENSE.

The second connection control component 412 may electrically connect the sensing node SO to the power supply voltage VCORE terminal in response to a second control signal SA_PRECH_N and the logic level to be stored in the latch 430.

The third connection control component 413 may electrically connect the sensing node SO to the ground voltage VSS terminal in response to a third control signal SA_DISCH and the logic level to be stored in the latch 430.

The first control signals SEL_BL, PBSENSE and SA_SENSE, the second control signal SA_PRECH_N and the third control signal SA_DISCH may be generated by the control logic 153 included in the control circuit 152. In addition, the control logic 153 may activate the first control signals SEL_BL, PBSENSE and SA_SENSE, the second control signal SA_PRECH_N and the third control signal SA_DISCH from a fourth time point to a second time point during the first program loop PL1 among the plurality of program loops PL1 to PLn according to the ISPP scheme. In addition, the control logic 153 may activate the first control signals SEL_BL, PBSENSE and SA_SENSE, the second control signal SA_PRECH_N and the third control signal SA_DISCH from a fourth time point to a fifth time point during each of the remaining program loops PL2 to PLn except for the first program loop PL1 among the plurality of program loops PL1 to PLn according to the ISPP scheme.

Herein, the fourth time point may be a time point ahead of a first time point at which a pass voltage starts to be applied to a plurality of word lines included in a memory block selected as a program target. The second time point, which is later than the first time point, may be a time point at which a program voltage starts to be applied to a word line as the program target among the plurality of word lines included in the memory block selected as the program target. The fifth time point may be a time point the same as or ahead of the first time point at which the pass voltage starts to be applied to all of the word lines of the selected memory block.

According to an embodiment, the first connection control component 411 may include three transistors N1, N2 and N6. In this case, the three transistors N1, N2 and N6 included in the first connection control component 411 may be all NMOS transistors.

According to an embodiment, a first transistor N1 included in the first connection control component 411 may be turned on in response to a page buffer sensing signal PBSENSE among the first control signals SEL_BL, PBSENSE and SA_SENSE. That is, the page buffer sensing signal PBSENSE may be applied to a gate terminal of the first transistor N1, a drain terminal of the first transistor N1 may be connected to a node to which a source terminal of a second transistor N2 and a drain terminal of a third transistor N3 are electrically connected, and a source terminal of the first transistor N1 may be connected to a source terminal of a sixth transistor N6.

Since the first transistor N1 is the NMOS transistor, a case in which the page buffer sensing signal PBSENSE among the first control signals SEL_BL, PBSENSE and SA_SENSE is in a logic "high" state may be regarded as an active state. In addition, when the page buffer sensing signal PBSENSE is in the active state, the page buffer sensing signal PBSENSE may have a level, which is sufficient to turn on the first transistor N1 but is equal to or less than the level of the power supply voltage VCORE. For example, the level of the power supply voltage VCORE is 1.8 V, the page buffer sensing signal PBSENSE may have a level between 1.1 V and 1.8 V. According to an embodiment, a potential level of the page buffer sensing signal PBSENSE may increase in a stepwise manner when transitioning from an inactive state to the active state.

According to an embodiment, the second transistor N2 included in the first connection control component 411 may be turned on in response to a bit line selection signal SEL_BL among the first control signals SEL_BL, PBSENSE and SA_SENSE. That is, the bit line selection signal SEL_BL may be applied to a gate terminal of the second transistor N2, a drain terminal of the second transistor N2 may be connected to the bit line BL, and the source terminal of the second transistor N2 may be connected to a node to which the drain terminal of the third transistor N3 and the drain terminal of the first transistor N1 are electrically connected.

Since the second transistor N2 is the NMOS transistor, a case in which the bit line selection signal SEL_BL among the first control signals SEL_BL, PBSENSE and SA_SENSE is in a logic "high" state may be regarded as an active state. In addition, when the bit line selection signal SEL_BL is in the active state, the bit line selection signal SEL_BL may have a potential level, which is sufficient to turn on the second transistor N2, for example, the level of the power supply voltage VCORE.

According to an embodiment, the sixth transistor N6 included in the first connection control component 411 may be turned on in response to a sensing signal SA_SENSE among the first control signals SEL_BL, PBSENSE and SA_SENSE. That is, the sensing signal SA_SENSE may be applied to a gate terminal of the sixth transistor N6, a drain terminal of the sixth transistor N6 may be connected to the sensing node SO, and the source terminal of the sixth transistor N6 may be connected to the source terminal of the first transistor N1.

Since the sixth transistor N6 is the NMOS transistor, a case in which the sensing signal SA_SENSE among the first control signals SEL_BL, PBSENSE and SA_SENSE is in a logic "high" state may be regarded as an active state. In addition, when the sensing signal SA_SENSE is in the active state, the sensing signal SA_SENSE may have a potential level, which is sufficient to turn on the sixth transistor N6, for example, the level of the power supply voltage VCORE.

According to an embodiment, the second connection control component 412 may include two transistors N4 and N5. In this case, the two transistors N4 and N5 included in the second connection control component 412 may be all PMOS transistors.

According to an embodiment, a fourth transistor N4 included in the second connection control component 412 may be turned on in response to a logic level of a first node QS of the latch 430. That is, the first node QS of the latch 430 may be connected to a gate terminal of the fourth transistor N4, a source terminal of the fourth transistor N4 may be connected to the power supply voltage VCORE terminal, and a drain terminal of the fourth transistor N4 may be connected to a source terminal of a fifth transistor N5.

Since the fourth transistor N4 is the PMOS transistor, the fourth transistor N4 may be turned on when the first node QS of the latch 430 is in a logic "low" state.

According to an embodiment, the fifth transistor N5 included in the second connection control component 412 may be turned on in response to the second control signal SA_PRECH_N. That is, the second control signal SA_PRECH_N may be applied to a gate terminal of the fifth transistor N5, a source terminal of the fifth transistor N5 may be connected to the drain terminal of the fourth transistor N4, and a drain terminal of the fifth transistor N5 may be connected to the sensing node SO.

Since the fifth transistor N5 is the PMOS transistor, a case in which the second control signal SA_PRECH_N is in a logic "low" state may be regarded as an active state. In addition, when the second control signal SA_PRECH_N is in the active state, the second control signal SA_PRECH_N may have a potential level, which is sufficient to turn on the fifth transistor N5, for example, the level of the ground voltage VSS.

According to an embodiment, the third connection control component 413 may include two transistors N8 and N9. In this case, the two transistors N8 and N9 included in the third connection control component 413 may be all NMOS transistors.

According to an embodiment, a ninth transistor N9 included in the third connection control component 413 may be turned on in response to the logic level of the first node QS of the latch 430. That is, the first node QS of the latch 430 may be connected to a gate terminal of the ninth transistor N9, a source terminal of the ninth transistor N9 may be connected to the ground voltage VSS terminal, and a drain terminal of the ninth transistor N9 may be connected to a source terminal of the eighth transistor N8.

Since the ninth transistor N9 is the NMOS transistor, the ninth transistor N9 may be turned on when the first node QS of the latch 430 is in a logic "high" state.

According to an embodiment, an eighth transistor N8 included in the third connection control component 413 may be turned on in response to the third control signal SA_DISCH. That is, the third control signal SA_DISCH may be applied to a gate terminal of the eighth transistor N8, the source terminal of the eighth transistor N8 may be connected to the drain terminal of the ninth transistor N9, and a drain terminal of the eighth transistor N8 may be connected to the sensing node SO.

Since the eighth transistor N8 is the NMOS transistor, a case in which the third control signal SA_DISCH is in a logic "high" state may be regarded as an active state. In addition, when the third control signal SA_DISCH is in the active state, the third control signal SA_DISCH may have a potential level, which is sufficient to turn on the eighth transistor N8, for example, the level of the power supply voltage VCORE.

In addition, the bit line controller 410 included in each PBx of the plurality of page buffers PB1 to PBm may further include the third transistor N3 other than the first, second and third connection control components 411, 412 and 413 described above. The third transistor N3 may be an NMOS transistor.

According to an embodiment, the third transistor N3 may be turned on in response to a bit line discharge signal BLDIS. That is, the bit line discharge signal BLDIS may be applied to a gate terminal of the third transistor N3, a drain terminal of the third transistor N3 may be connected to a node to which the source terminal of the second transistor N2 and the drain terminal of the first transistor N1 are electrically connected, and a source terminal of the third transistor N3 may be connected to the ground voltage VSS terminal.

The bit line discharge signal BLDIS may be a signal generated by the control logic 153 included in the control circuit 152. The bit line discharge signal BLDIS may be activated to discharge a potential level of the bit line BL to the level of the ground voltage VSS, and thus turn on the third transistor N3.

More specifically, the latch 430 included in each of the plurality of page buffers PB1 to PBm may include a first inverter IV1, a second inverter IV2, a $10^{th}$ transistor N10, an 11th transistor N11, a 12th transistor N12 and a 13th transistor N13. In this case, the 10th transistor N10, the 11th transistor N11, the 12th transistor N12 and the 13th transistor N13 may be all NMOS transistors.

The first and second inverters IV1 and IV2 may be connected in reverse parallel between the first node QS and a second node QS_N of the latch 430.

The 10th transistor N10 and the 11th transistor N11 may be connected in series between the first node QS of the latch 430 and the ground voltage VSS terminal. The 10th transistor N10 may be turned on in response to a first reset signal SRST, and the 11th transistor N11 may be turned on in response to a second reset signal PBRST. When the 10th and 11th transistors N10 and N11 are turned on, the first node QS and the ground voltage VSS terminal may be connected to each other.

The 12th transistor N12 and the 13th transistor N13 may be connected in series between the second node QS_N of the latch 430 and the ground voltage VSS terminal. The 12th transistor N12 may be turned on according to a potential level of the sensing node SO, and the 13th transistor N13 may be turned on in response to a set signal SSET. When the 12th and 13th transistors N12 and N13 are turned on, the second node QS_N and the ground voltage VSS terminal may be connected to each other.

The first reset signal RST, the second reset signal PBRST and the set signal SSET may be signals generated by the control logic 153 included in the control circuit 152. The first reset signal RST and the second reset signal PBRST may be used to initialize the logic level to be stored in the latch 430. The set signal SSET may be used to perform an operation of storing the potential level of the sensing node SO as a logic level.

Figure 6:
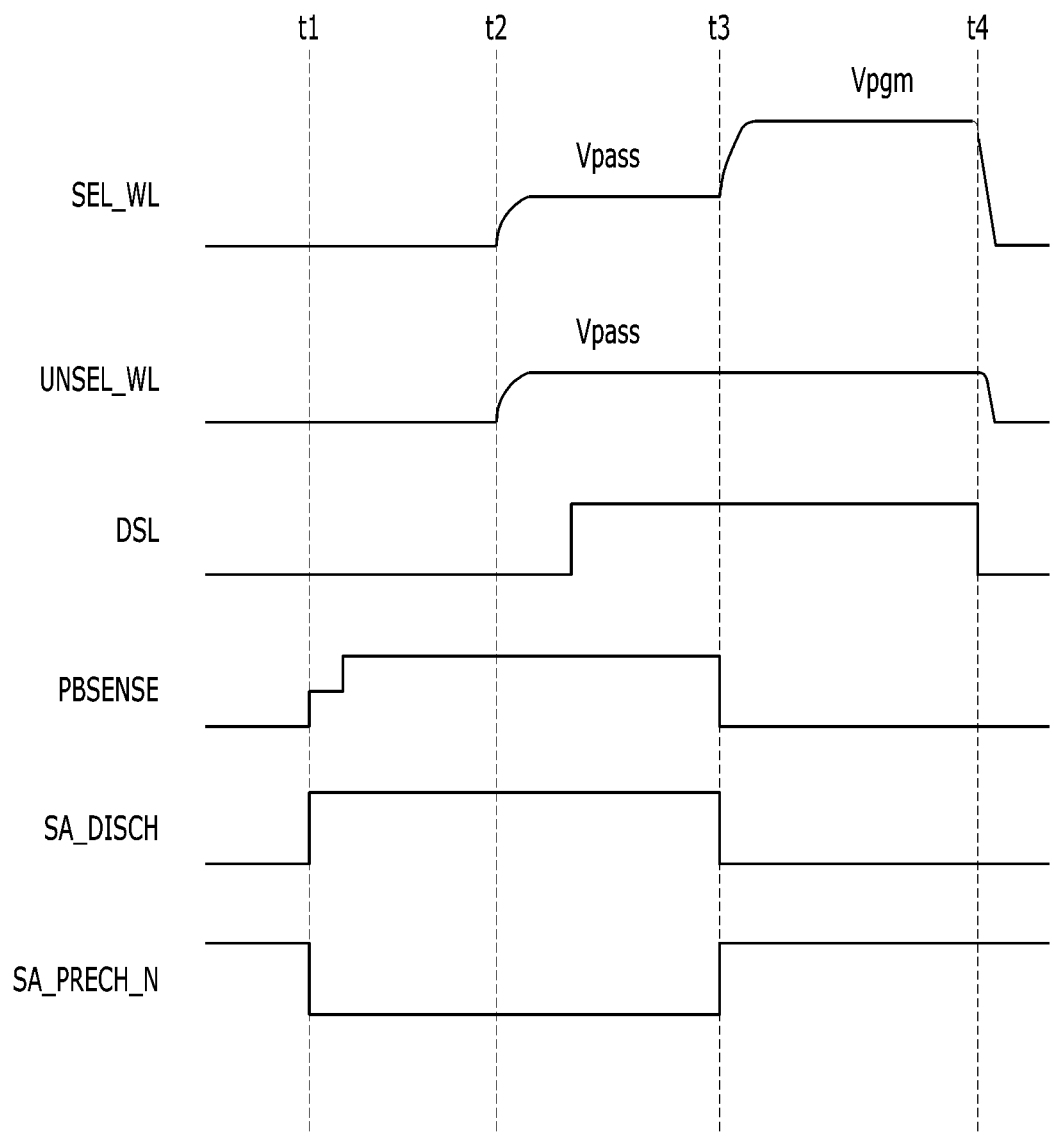
FIG. 6 is a diagram illustrating a first program loop of a program operation according to an incremental step pulse program (ISPP) scheme in accordance with an embodiment of the present disclosure.

FIG. 6 is a diagram illustrating a first program loop of the program operation according to the ISPP scheme in accordance with an embodiment of the present disclosure.

Referring to FIGS. 1 to 6, it may be seen how the first program loop PL1 among the plurality of program loops PL1 to PLn is performed in the program operation.

First, a pass voltage Vpass may be applied to all word lines SEL_WL and UNSEL_WL included in a selected memory block from a first time point t2 to a second time point t3 after a start time point of the first program loop PL1.

Subsequently, a program voltage Vpgm may be applied to a selected word line SEL_WL among all of the word lines SEL_WL and UNSEL_WL included in the selected memory block, and the pass voltage Vpass may be applied to an unselected word line UNSEL_WL, from the second time point t3 to a third time point t4 of the first program loop PL1.

When the first program loop PL1 is performed, a bit line precharge operation of precharging each of the plurality of bit lines BL1 to BLm connected to the plurality of memory cells to a predetermined potential level may start from a fourth time point t1 ahead of the first time point t2 at which the pass voltage Vpass starts to be applied to all of the word lines SEL_WL and UNSEL_WL included in the selected memory block.

The bit line precharge operation starting at the fourth time point t1 may be performed until the second time point t3 at which the program voltage Vpgm starts to be applied to the selected word line SEL_WL among all of the word lines SEL_WL and UNSEL_WL included in the selected memory block.

That is, when the first program loop PL1 is performed, the bit line precharge operation of precharging each of the plurality of bit lines BL1 to BLm connected to the plurality of memory cells to the predetermined potential level may be performed from the fourth time point t1 to the second time point t3.

In order to control the bit line precharge operation, the first control signals SEL_BL, PBSENSE and SA_SENSE, the second control signal SA_PRECH_N and the third control signal SA_DISCH may be activated at the fourth time point t1, and then deactivated at the second time point t3.

The first control signals SEL_BL, PBSENSE and SA_SENSE and the third control signal SA_DISCH may be activated to a logic "high" level at the fourth time point t1, and deactivated to a logic "low" level at the second time point t3. The second control signal SA_PRECH_N may be activated to a logic "low" level at the fourth time point t1, and deactivated to a logic "high" level at the second time point t3.

Referring to FIG. 6, it may be seen that the page buffer sensing signal PBSENSE among the first control signals SEL_BL, PBSENSE and SA_SENSE is activated to the logic "high" level at the fourth time point t1, and then deactivated to the logic "low" level at the second time point t3. As such, although only the activation or deactivation of the page buffer sensing signal PBSENSE is illustrated in the drawing, the other signals SEL_BL and SA_SENSE except for the page buffer sensing signal PBSENSE may also be activated to the logic "high" level at the fourth time point t1, and then deactivated to the logic "low" level at the second time point t3.

When the first control signals SEL_BL, PBSENSE and SA_SENSE are activated at the fourth time point t1, the sensing node SO included in each of the plurality of page buffers PB1 to PBm may be electrically connected to the bit lines BL1 to BLm.

When the second control signal SA_PRECH_N and the third control signal SA_DISCH are activated at the fourth time point t1, the sensing node SO may be electrically connected to the power supply voltage VDD terminal or the ground voltage VSS terminal according to the logic level of the first node QS of the latch 430.

The logic level to be stored in the latch 430 included in each of the plurality of page buffers PB1 to PBm may be determined according to whether programming is allowed for each of the plurality of bit lines BL1 to BLm before the fourth time point t1.

That is, the control circuit 152 may control the operations of the plurality of page buffers PB1 to PBm so that the first logic level is stored in the latch 430 corresponding to the first bit line for which the programming is allowed among the plurality of bit lines BL1 to BLm before the fourth time point t1.

For example, the control circuit 152 may control the operations of the plurality of page buffers PB1 to PBm so that the first node QS of the latch 430 corresponding to the first bit line has the level of the power supply voltage VDD before the fourth time point t1.

Figure 8:
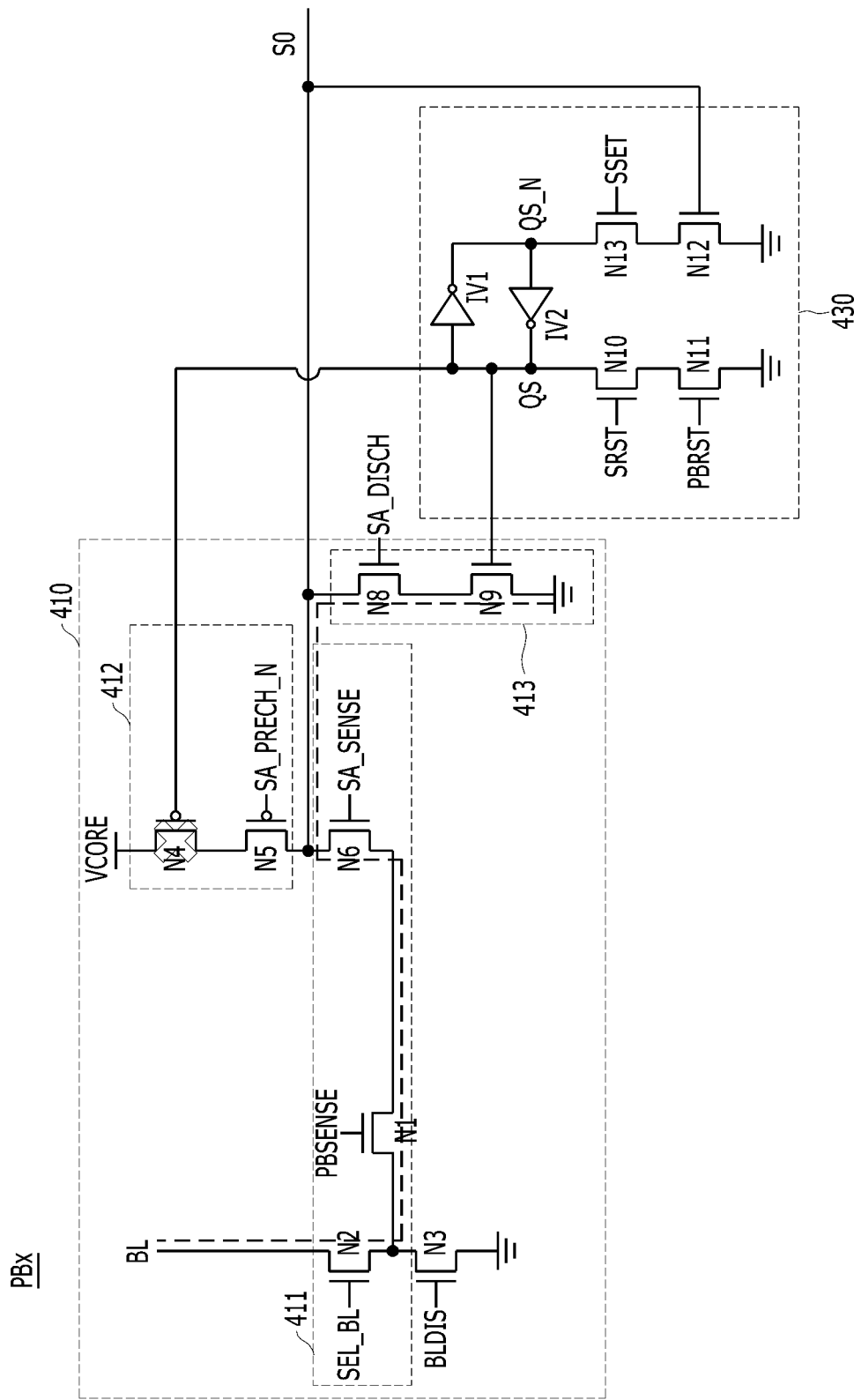
FIGS. 8 and 9 are diagrams illustrating an operation of the page buffer illustrated in FIG. 5 in accordance with an embodiment of the present disclosure.

When the first node QS of the latch 430 corresponding to the first bit line is set to the level of the power supply voltage VDD, the first bit line may be in a state as illustrated in FIG. 8 in response to the activation of the first control signals SEL_BL, PBSENSE and SA_SENSE, the second control signal SA_PRECH_N and the third control signal SA_DISCH from the fourth time point t1 to the second time point t3. That is, since the first bit line and the ground voltage VSS terminal are electrically connected from the fourth time point t1 to the second time point t3, the first bit line may be precharged to the level of the ground voltage VSS.

In addition, the control circuit 152 may control the operations of the plurality of page buffers PB1 to PBm so that the second logic level is stored in the latch 430 corresponding to the second bit line for which the programming is inhibited among the plurality of bit lines BL1 to BLm.

For example, the control circuit 152 may control the operations of the plurality of page buffers PB1 to PBm so that the first node QS of the latch 430 corresponding to the second bit line has the level of the ground voltage VSS before the fourth time point t1.

Figure 9:
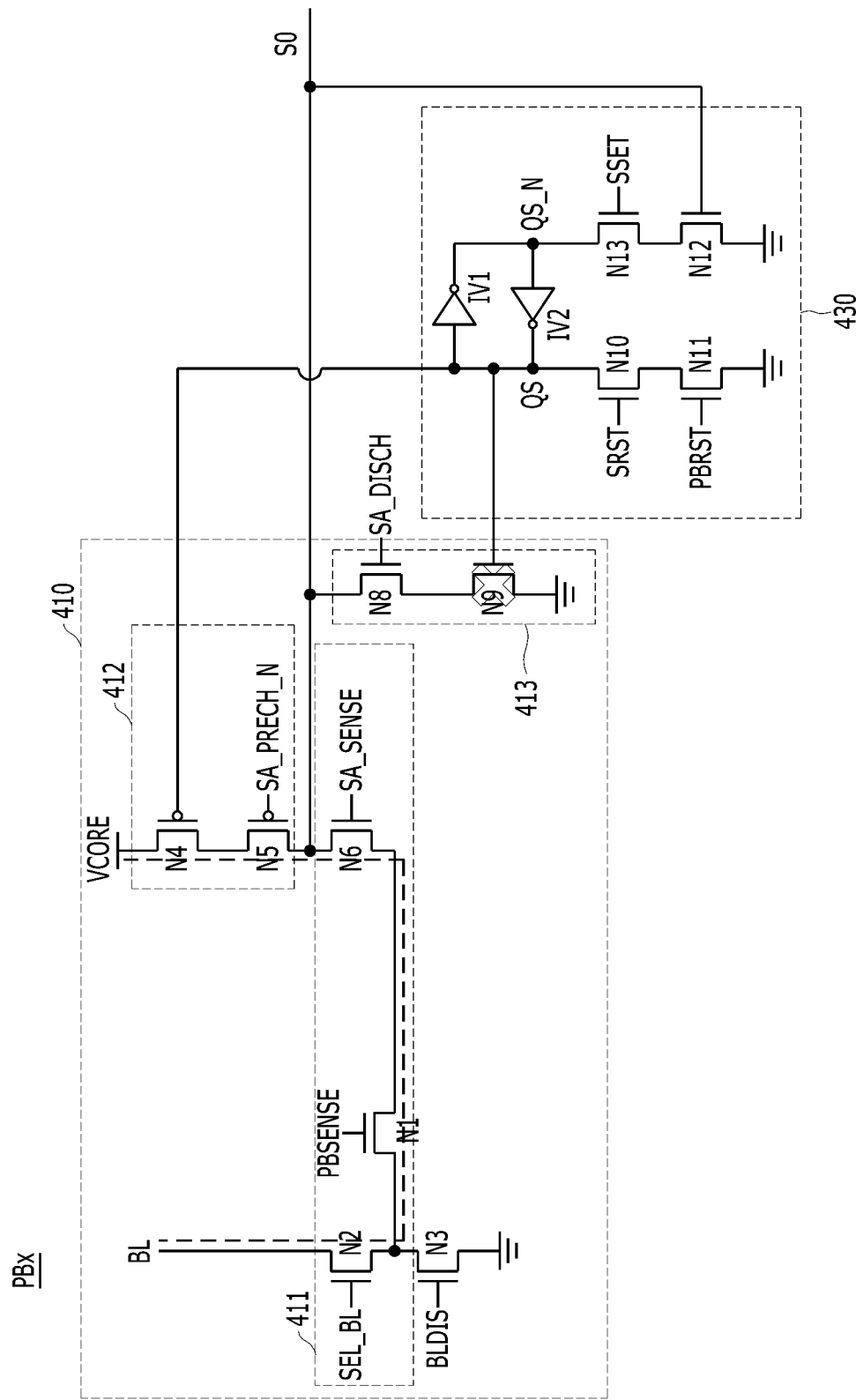

When the first node QS of the latch 430 corresponding to the second bit line is set to the level of the ground voltage VSS, the second bit line may be in a state as illustrated in FIG. 9 in response to the activation of the first control signals SEL_BL, PBSENSE and SA_SENSE, the second control signal SA_PRECH_N and the third control signal SA_DISCH from the fourth time point t1 to the second time point t3. That is, since the second bit line and the power supply voltage VDD terminal are electrically connected from the fourth time point t1 to the second time point t3, the second bit line may be precharged to the level of the power supply voltage VDD.

For reference, when the page buffer sensing signal PBSENSE transitions from an inactive state to an active state at the fourth time point t1, it may be seen that the potential level thereof increases in a stepwise manner. When the page buffer sensing signal PBSENSE transitions to a maximum active potential level at a time at the fourth time point t1, a phenomenon in which a peak current of the memory device becomes excessively high may occur. However, such a stepwise increase in the potential level of the page buffer sensing signal PBSENSE may be a method used to prevent the phenomenon. In addition, when the signals SEL_BL and SA_SENSE, which are not directly illustrated in the drawing among the first control signals SEL_BL, PBSENSE and SA_SENSE, transition from the inactive state to the active state at the fourth time point t1, the potential levels of the signals SEL_BL and SA_SENSE may increase in a stepwise manner like the page buffer sensing signal PBSENSE or increase at a time unlike the page buffer sensing signal PBSENSE.

Figure 7:
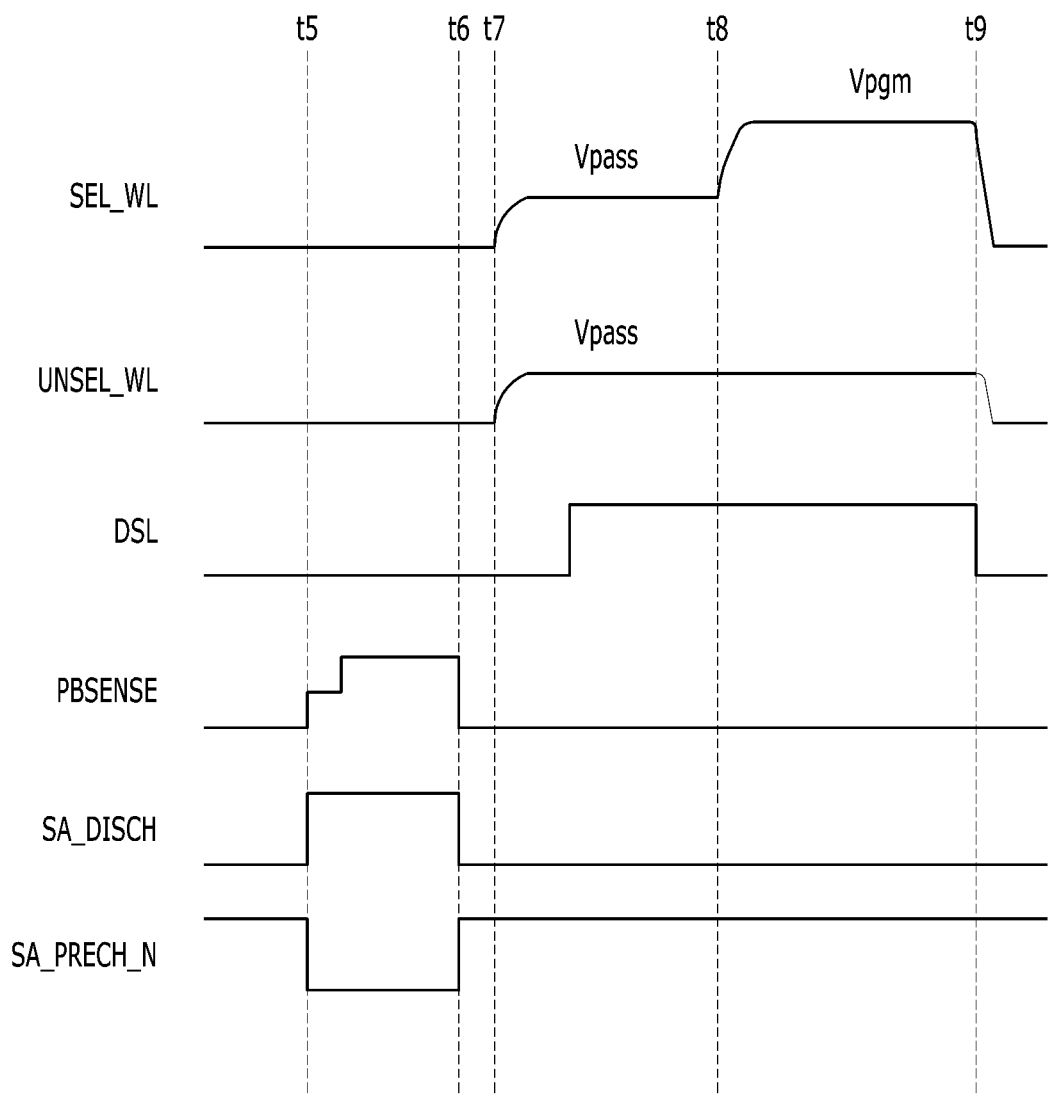
FIG. 7 is a diagram illustrating a program loop other than the first program loop of the program operation in accordance with an embodiment of the present disclosure.

FIG. 7 is a diagram illustrating one of the remaining program loops except for the first program loop of the program operation in accordance with an embodiment of the present disclosure.

Referring to FIGS. 1 to 7, it may be seen how each of the remaining program loops PL2 to PLm except for the first program loop PL1 among the plurality of program loops PL1 to PLm is performed in the program operation.

First, the pass voltage Vpass may be applied to all word lines SEL_WL and UNSEL_WL included in a selected memory block from a first time point t7 to a second time point t8 after a starting time point of each of the remaining program loops PL2 to PLm except for the first program loop PL1.

Subsequently, a program voltage Vpgm may be applied to a selected word line SEL_WL among all of the word lines SEL_WL and UNSEL_WL included in the selected memory block, and the pass voltage Vpass may be applied to an unselected word line UNSEL_WL, from the second time point t8 to a third time point t9 of each of the remaining program loops PL2 to PLm except for the first program loop PL1.

When each of the remaining program loops PL2 to PLm except for the first program loop PL1 is performed, a bit line precharge operation of precharging each of the plurality of bit lines BL1 to BLm connected to the plurality of memory cells to a predetermined potential level may start from a fourth time point t5 ahead of the first time point t7 at which the pass voltage Vpass starts to be applied to all the word lines SEL_WL and UNSEL_WL included in the selected memory block.

The bit line precharge operation starting at the fourth time point t5 may be performed until a fifth time point t6 that is the same as or ahead of the first time point t7 at which the pass voltage Vpass starts to be applied to all of the word lines SEL_WL and UNSEL_WL included in the selected memory block. For reference, although FIG. 7 illustrates that the fifth time point t6 is ahead of the first time point t7, this is merely an embodiment, and the fifth time point t6 and the first time point t7 may be the same time point, according to the decision of a device designer.

That is, when each of the remaining program loops PL2 to PLm except for the first program loop PL1 is performed, the bit line precharge operation of precharging each of the plurality of bit lines BL1 to BLm connected to the plurality of memory cells to the predetermined potential level may be performed from the fourth time point t5 to the fifth time point t6.

In order to control the bit line precharge operation, the first control signals SEL_BL, PBSENSE and SA_SENSE, the second control signal SA_PRECH_N and the third control signal SA_DISCH may be activated at the fourth time point t5, and then deactivated at the fifth time point t6.

The first control signals SEL_BL, PBSENSE and SA_SENSE and the third control signal SA_DISCH may be activated to a logic "high" level at the fourth time point t5, and deactivated to a logic "low" level at the fifth time point t6. The second control signal SA_PRECH_N may be activated to a logic "low" level at the fourth time point t5, and deactivated to a logic "high" level at the fifth time point t6.

Referring to FIG. 7, it may be seen that the page buffer sensing signal PBSENSE among the first control signals SEL_BL, PBSENSE and SA_SENSE is activated to the logic "high" level at the fourth time point t5, and then deactivated to the logic "low" level at the fifth time point t6. As such, although only the activation or deactivation of the page buffer sensing signal PBSENSE is illustrated in the drawing, the other signals SEL_BL and SA_SENSE except for the page buffer sensing signal PBSENSE may also be activated to the logic "high" level at the fourth time point t5, and then deactivated to the logic "low" level at the fifth time point t6.

When the first control signals SEL_BL, PBSENSE and SA_SENSE are activated at the fourth time point t5, the sensing node SO included in each of the plurality of page buffers PB1 to PBm may be electrically connected to the bit lines BL1 to BLm.

When the second control signal SA_PRECH_N and the third control signal SA_DISCH are activated at the fourth time point t5, the sensing node SO may be electrically connected to the power supply voltage VDD terminal or the ground voltage VSS terminal according to the logic level of the first node QS of the latch 430.

The logic level to be stored in the latch 430 included in each of the plurality of page buffers PB1 to PBm may be determined according to whether programming is allowed for each of the plurality of bit lines BL1 to BLm before the fourth time point t5.

The control circuit 152 may control the operations of the plurality of page buffers PB1 to PBm so that the first logic level is stored in the latch 430 corresponding to the first bit line for which the programming is allowed among the plurality of bit lines BL1 to BLm before the fourth time point t5.

For example, the control circuit 152 may control the operations of the plurality of page buffers PB1 to PBm so that the first node QS of the latch 430 corresponding to the first bit line has the level of the power supply voltage VDD before the fourth time point t5.

When the first node QS of the latch 430 corresponding to the first bit line is set to the level of the power supply voltage VDD, the first bit line may be in a state as illustrated in FIG. 8 in response to the activation of the first control signals SEL_BL, PBSENSE and SA_SENSE, the second control signal SA_PRECH_N and the third control signal SA_DISCH from the fourth time point t5 to the fifth time point t6. That is, since the first bit line and the ground voltage VSS terminal are electrically connected from the fourth time point t5 to the fifth time point t6, the first bit line may be precharged to the level of the ground voltage VSS.

In addition, the control circuit 152 may control the operations of the plurality of page buffers PB1 to PBm so that the second logic level is stored in the latch 430 corresponding to the second bit line for which the programming is inhibited among the plurality of bit lines BL1 to BLm.

For example, the control circuit 152 may control the operations of the plurality of page buffers PB1 to PBm so that the first node QS of the latch 430 corresponding to the second bit line has the level of the ground voltage VSS before the fourth time point t5.

When the first node QS of the latch 430 corresponding to the second bit line is set to the level of the ground voltage VSS, the second bit line may be in a state as illustrated in FIG. 9 in response to the activation of the first control signals SEL_BL, PBSENSE and SA_SENSE, the second control signal SA_PRECH_N and the third control signal SA_DISCH from the fourth time point t5 to the fifth time point t6. That is, since the second bit line and the power supply voltage VDD terminal are electrically connected from the fourth time point t5 to the fifth time point t6, the second bit line may be precharged to the level of the power supply voltage VDD.

For reference, when the page buffer sensing signal PBSENSE transitions from an inactive state to an active state at the fourth time point t5, it may be seen that the potential level thereof increases in a stepwise manner. When the page buffer sensing signal PBSENSE transitions to a maximum active potential level at a time at the fourth time point t5, a phenomenon in which a peak current of the memory device becomes excessively high may occur. However, such a stepwise increase in the potential level of the page buffer sensing signal PBSENSE may be a method used to prevent the phenomenon. In addition, when the signals SEL_BL and SA_SENSE, which are not directly illustrated in the drawing among the first control signals SEL_BL, PBSENSE and SA_SENSE, transition from the inactive state to the active state at the fourth time point t5, the potential levels of the signals SEL_BL and SA_SENSE may increase in a stepwise manner like the page buffer sensing signal PBSENSE or increase at a time unlike the page buffer sensing signal PBSENSE.

According to the embodiments of the present disclosure, a period in which a bit line is precharged in a first program loop during a program operation according to an incremental step pulse program (ISPP) scheme may be controlled to have a longer time than a period in which the bit line is precharged in each of the remaining program loops except for the first program loop.

Accordingly, it is possible to prevent program efficiency from decreasing due to channel boosting in the first program loop of the program operation.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims.

For example, dispositions and types of the logic gates and transistors described in the aforementioned embodiments may be implemented differently based on the polarity of an inputted signal. Furthermore, the embodiments may be combined to form additional embodiments.

What is claimed is:
1. A memory device comprising:
   a memory cell array including a plurality of memory cells coupled between a plurality of word lines and a plurality of bit lines; and
   a control circuit suitable for performing a program operation of repeatedly performing a program loop until programming is completed according to an incremental step pulse program (ISPP) scheme, the program loop including:
   applying a pass voltage to each of a first word line selected as a program target and a second word line unselected among the plurality of word lines from a first time point to a second time point, and
   applying a program voltage to the first word line and the pass voltage to the second word line from the second time point to a third time point,
   wherein the control circuit performs the program operation by:
   performing a bit line precharge operation of precharging each of the plurality of bit lines to a predetermined potential level from a fourth time point ahead of the first time point to the second time point during a first program loop, and
   performing the bit line precharge operation from the fourth time point to a fifth time point, which is the same as or ahead of the first time point, during each of remaining program loops except for the first program loop.
2. The memory device of claim 1,
   wherein the control circuit comprises:
   an address decoder suitable for applying the pass voltage or the program voltage to the plurality of word lines; and
   a plurality of page buffers connected to the plurality of memory cells through the plurality of bit lines, respectively, and
   wherein each of the plurality of page buffers comprises:
      a latch suitable for latching a logic level determined according to whether programming is allowed for a corresponding bit line; and
      a bit line controller suitable for electrically connecting the bit lines to a power supply voltage terminal or a ground voltage terminal based on the logic level latched by the latch, during the bit line precharge operation.

3. The memory device of claim 2, wherein the latch latches a first logic level when the programming is allowed for the corresponding bit line.

4. The memory device of claim 3, wherein the latch latches a second logic level when the programming is inhibited for the corresponding bit line.

5. The memory device of claim 4, wherein the bit line controller electrically connects the bit line to the ground voltage terminal when the latch latches the first logic level during the bit line precharge operation.

6. The memory device of claim 5, wherein the bit line controller electrically connects the bit line to the power supply voltage terminal when the latch latches the second logic level during the bit line precharge operation.

7. The memory device of claim 2, wherein the bit line controller comprises:
   a first connection control component suitable for electrically connecting the corresponding bit line to a sensing node in response to a first control signal;
   a second connection control component suitable for electrically connecting the sensing node to the power supply voltage terminal in response to a second control signal and the logic level of the latch; and
   a third connection control component suitable for electrically connecting the sensing node to the ground voltage terminal in response to a third control signal and the logic level of the latch.

8. The memory device of claim 7, wherein the control circuit further comprises a control logic suitable for:
   activating the first to third control signals from the fourth time point to the second time point during the first program loop, and
   activating the first to third control signals from the fourth time point to the fifth time point during each of the remaining program loops.

9. An operating method of a memory device including a plurality of memory cells coupled between a plurality of word lines and a plurality of bit lines, the operating method comprising:
   a program loop operation of applying a pass voltage to each of a first word line selected as a program target and a second word line unselected among the plurality of word lines from a first time point to a second time point after a starting time point, and applying a program voltage to the first word line and the pass voltage to the second word line from the second time point to a third time point; and
   a repetition operation of repeatedly performing the program loop operation according to an incremental step pulse program (ISPP) scheme until programming is completed,
   wherein the repetition operation includes:
   a first precharge operation of performing a bit line precharge operation of precharging each of the plurality of bit lines to a predetermined potential level from a fourth time point ahead of the first time point to the second time point during a first program loop operation first repeated in the repetition operation; and
   a second precharge operation of performing the bit line precharge operation from the fourth time point to a fifth time point, which is the same as or ahead of the first time point, during a subsequent program loop operation repeated after the first program loop operation in the repetition operation.

10. The operating method of claim 9, each of the first and second precharge operations includes:
    a latching operation of determining and latching a logic level corresponding to each of the plurality of bit lines, according to whether the programming is allowed for each of the plurality of bit lines during the program loop operation; and
    a connection operation of electrically connecting each of the plurality of bit lines to a power supply voltage terminal or a ground voltage terminal based on the latched logic level during the bit line precharge operation.

11. The operating method of claim 10, wherein the latching operation comprises:
    latching a first logic level corresponding to a first bit line for which the programming is allowed among the plurality of bit lines; and
    latching a second logic level corresponding to a second bit line for which the programming is inhibited among the plurality of bit lines.

12. The operating method of claim 11, wherein the connection operation comprises:
    electrically connecting the first bit line to the ground voltage terminal during the bit line precharge operation; and
    electrically connecting the second bit line to the power supply voltage terminal during the bit line precharge operation.

13. A method for operating a memory device, the method comprising:
    performing, on a memory cell array, a program operation including initial and subsequent program loops according to an incremental step pulse program (ISPP) scheme,
    wherein the initial program loop includes precharging a bit line coupled to the array before and while applying a pass voltage to all word lines coupled to the array,
    wherein the subsequent program loop includes precharging the bit line before the applying, and
    wherein the precharging in the initial program loop takes a greater time amount than the precharging in the subsequent program loop.

* * * * *